United States Patent [19]

Harrington

[11] 4,191,788

[45] Mar. 4, 1980

[54] METHOD TO REDUCE BREAKAGE OF V-GROOVED <100> SILICON SUBSTRATE

[75] Inventor: Alan L. Harrington, Glendale, Calif.

[73] Assignee: TRW Inc., Los Angeles, Calif.

[21] Appl. No.: 959,519

[22] Filed: Nov. 13, 1978

[51] Int. Cl.² .......................................... H01L 21/461
[52] U.S. Cl. ........................................ 427/82; 148/33.2;
156/662; 357/52; 357/54; 357/55; 427/86;
427/95; 427/355
[58] Field of Search ................. 427/82, 86, 402, 95,
427/355; 357/52, 54, 55; 148/33.2; 156/662

[56] References Cited

U.S. PATENT DOCUMENTS

| 3,699,644 | 10/1972 | Cocca | 427/82 |
| 3,806,771 | 4/1974 | Petruzella | 357/52 |
| 3,859,127 | 1/1975 | Lehner | 427/82 |
| 3,911,562 | 10/1975 | Youmans | 357/54 |
| 3,969,168 | 7/1976 | Kuhn | 427/85 |
| 4,014,037 | 3/1977 | Matsushita et al. | 357/52 |
| 4,053,335 | 10/1977 | Hu | 357/54 |
| 4,086,613 | 4/1978 | Biet et al. | 357/54 |

Primary Examiner—John D. Smith
Attorney, Agent, or Firm—Martin R. Horn

[57] ABSTRACT

Flat and parallel depositions of low pressure chemical vapor deposited (LPCVD) polycrystalline intrinsic silicon are formed on both sides of a wafer of P-I-N <100> V-grooved substrate of silicon to support the wafer during subsequent polish removal from the top surface. This structurally reinforces the crystal wafer and helps prevent warpage and cracking during subsequent handling.

7 Claims, 3 Drawing Figures

METHOD TO REDUCE BREAKAGE OF V-GROOVED <100> SILICON SUBSTRATE

BACKGROUND OF THE INVENTION

1. Description of the Prior Art

The mass production of semiconductor devices is presently accomplished by production of a single crystalline wafer from which many individual semiconductive crystals are formed. One method presently employed to produce such devices is the formation of aligned V-grooves in the wafer containing the semiconductive crystals so that after further processing the semiconductive crystals can be separated by breaking the wafer along the V-grooves.

However, there are certain disadvantages in using this process, one of which is that in forming aligned grooves in a wafer containing semiconductive crystals, the wafer is held together only by the thinned crystal portions lying beneath the grooves making the wafers fragile and susceptible to cracking. In general, the prior art method for supporting and strengthening the wafer is to deposit polycrystalline intrinsic silicon (hereafter sometimes poly) on the grooved side only and thus passivate the junction. This one sided deposition usually causes strain and the wafer will crack even though the wafer will remain intact. However, after the poly is polish removed the wafer will crack during polishing or subsequent fabrication of a semiconductor chip. Under the prior art method, the thick poly layer is grown on the wafer at high temperatures. Frequently, the combination of high temperatures and one-sided coating would cause warpage if special precautions were not taken.

An example of this prior art form of passivation is shown in U.S. Pat. No. 3,806,771. According to the method described in this prior art, the groove is passivated by a thick glass bonding layer. However, it is important that the thermal coefficient of expansion of this bonding layer be no greater than that of the silicon. This is because if it were greater, since the layer is applied to only one side of the wafer, there would be stresses incurred which could cause warpage and cracking. Thus, a special bonding material, which is not readily available and is expensive, is required. In addition, it is a difficult and slow process to apply such a thick bonding layer directly to the surface of the groove, and the process is not readily adaptable to application of such a layer to both sides of the wafer.

Low pressure chemical vapor deposition has been used in the prior art to apply a very thin poly layer to the V-grooved side as a seed for growth of a thicker layer. However, no two-sided deposition has been used in this manner. This type of deposition is slow and has not been considered for application of a relatively thick (7μ) support layer.

As mentioned before, when the above method of one-sided reinforcement is used, with only one side of the wafer reinforced, the wafer would be under strain and would be unstable. This results in the breakage of virtually every wafer at some time during the processing and subsequent handling of the wafers. Thus, one-sided support has proved to be ineffective.

BRIEF SUMMARY OF THE INVENTION

It is the object of this invention to form a flat and parallel deposition of low pressure chemical vapor deposited (LPCVD) polycrystalline intrinsic silicon onto both sides of a P-I-N <100> V-grooved substrate to support the wafer containing many individual semiconductor crystals during subsequent polish removal of poly from the top, V-grooved surface. The wafers will be subjected to less strain than if the passivating layer were applied only to the V-grooved side. The result is that wafers will be less likely to crack and warp than with prior art methods. Also, cracked wafers will not come apart and whole wafers will not come unglued.

This objective is accomplished by using LPCVD techniques, as are well known in the art, to form a flat and parallel deposition of polycrystalline intrinsic silicon (poly) onto both sides of the V-grooved wafer. This forms an envelope of poly around the fragile wafer, thus equalizing any pressures on both sides of the wafer and keeping the whole assembly very stable. Since the wafer is completely enveloped by the poly, it is unnecessary to use any special bonding material. In other words, it is not a requirement using the process of this invention, that the thermal coefficient of expansion of the bonding layer be no greater than that of the silicon. Therefore, undoped polycrystalline intrinsic silicon may be used for the bonding layer without the danger of causing stresses as is possible when coating only one side.

The thin poly layer then provides an excellent seeding surface for easy growth of a thick poly layer to fill in the V-grooves and further stablize the wafer.

When the poly layer is polish removed from the V-grooved side of the wafer, the poly layer on the bottom side remains to keep the wafer stable during subsequent handling. This is especially beneficial when using a P-I-N <100> substrate as <100> oriented silicon cracks more easily than a <111> substrate which is another type of crystal orientation used in similar devices. However, even though <111> oriented silicon is more durable than <100>, the method of the present invention is still useful as protection in the handling of <111> substrates. Thus, the present invention is applicable to any similar wafer with any type grooves which may be susceptible to breakage.

Empirical results have shown the method of the present invention to reduce breakage of the wafers to less than 10%, a significant improvement over the prior art breakage rate of over 90%.

The novel features which are believed to be characteristic of the invention, both as to its organization and method of operation, together with further objectives and advantages thereof, will be better understood from the following description considered in connection with the accompanying drawings in which a presently preferred embodiment of the invention is illustrated by way of example. It is to be expressly understood, however, that the drawings are for the purpose of illustration and description only, and are not intended as a definition of the limits of the invention.

DETAILED DESCRIPTION OF THE PREFERRED EMBODIMENT

Figure 1:
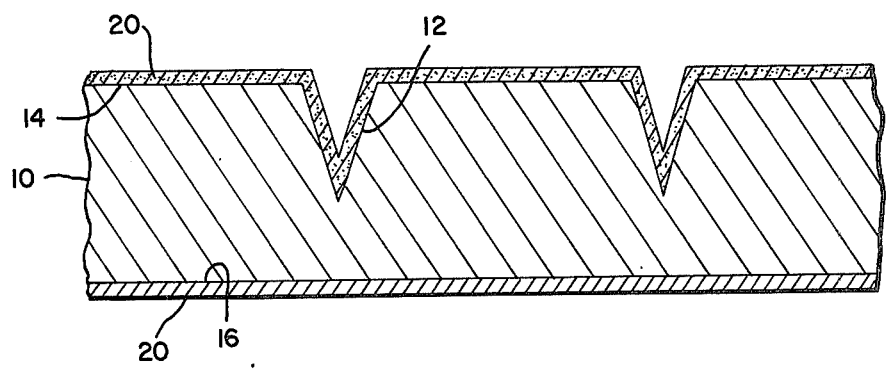
FIG. 1 is a cross-sectional view of semiconductive assemblies as part of a common V-grooved wafer with a layer of LPCVD polycrystalline intrinsic silicon deposited onto both sides of the wafer.

Referring first to FIG. 1 there is shown a wafer 10 containing a plurality of conventional semiconductive assemblies 18 separated by aligned V-grooves 12. The structure, without support, is very weak and subject to cracking at the narrow point under the V-groove 12. To help support the wafer 10, first a thin (approximately 7 to 10μ), flat layer of polycrystalline intrinsic silicon (poly) 20 is deposited on both the top surface 14 and the bottom surface 16 of the wafer 10, including the surface of the V-grooves 12 by low pressure chemical vapor deposition (LPCVD) techniques as are well known in the art. The deposition is accomplished at a temperature of 650° Centigrade and a pressure of approximately 1 Torr. Under these conditions, the undoped poly is deposited on the wafer at a rate of about 125 Angstroms per minute. This, in effect forms an envelope of poly around the wafer thus equalizing pressures on both sides and preventing warpage and cracking. As a result of this two-sided deposition, it is possible to use pure, undoped poly to form the LPCVD poly layers 20 and a special composition is not required. It is not necessary that the thermal coefficient of expansion of the poly be no greater than that of the silicon. Thus, there are advantages of cost and convenience of the present invention over the prior art.

Figure 2:
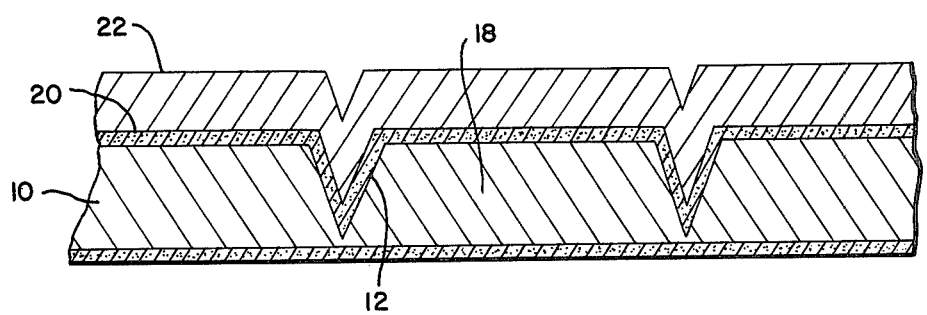
FIG. 2 is a cross-sectional view of semiconductive assemblies as part of a common V-grooved wafer after deposition of a thick polycrystalline intrinsic silicon layer on the V-grooved side of the wafer.

The next step, as shown in FIG. 2 is the application of a thick poly layer 22, at least thick enough to completely fill in all of the V-grooves 12, to the top of the LPCVD poly layer 20 on the V-grooved side of the wafer 10. This is accomplished by using the LPCVD poly 20 on the top surface 14 of the wafer 10 as a seed for growth of the thick poly layer 22. The use of the LPCVD poly 20 as a seed greatly facilitates the growth of the thick poly layer 22. The result is to completely fill the V-grooves 12 with poly, thereby stabilizing the wafer 10 even further.

Figure 3:
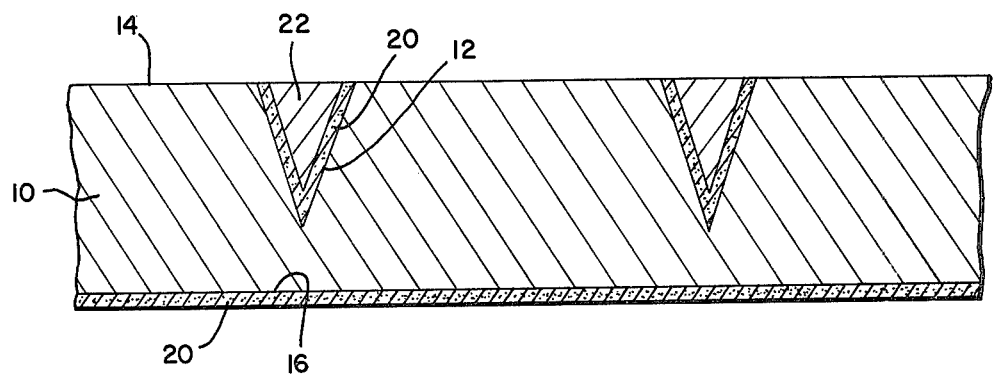
FIG. 3 is a cross-sectional view of semiconductive assemblies as part of a common V-grooved wafer after the top V-grooved side of the wafer has been polished back to the original single crystal surface.

The final step as shown in FIG. 3 is to polish remove both the poly layer 20 and the thick poly layer 22 from the top surface 14 of the wafer 10. This leaves the poly layers 20 and 22 filling the V-groove 12 thus strengthening the V-groove 12. Also, the poly layer 20 is left on the bottom surface 16 of the wafer 10 thus continuing to support the entire assembly. The result is that wafers will be less likely to crack and warp than with prior art methods. Also, cracked wafers will not come apart and whole wafers will not come unglued. In practice, the method of the present invention described above has resulted in a breakage ratio of less than 10% as compared with the prior art rate of greater than 90%.

While a wide variety of materials, shapes and other configurations can be used in this invention, it should be understood that changes can be made without departing from the spirit or scope of this invention. The invention, therefore, is not to be limited to the specific embodiments discussed and illustrated herein, but rather only by the scope of the appended claims.

I claim:

1. A method for passivating and supporting a V-grooved substrate wafer of silicon for future processing comprising the production of a thin polycrystalline intrinsic silicon layer, of approximately 7 to 10μ thickness, on the top and bottom sides of the wafer.

2. The method according to claim 1 in which said substrate is comprised of <100> oriented silicon.

3. The method according to claim 2 in which said thin polycrystalline intrinsic silicon layer is applied by low pressure chemical vapor deposition techniques.

4. The method according to claim 1 in which a thick polycrystalline intrinsic silicon layer is applied on top of the thin polycrystalline intrinsic silicon layer on the top or grooved side of the wafer, such that said thick layer is sufficient to fill the grooves and thereby further passivating the grooves.

5. The method according to claim 4 in which said polycrystalline intrinsic silicon layers on the top of the wafer are subsequently removed by polishing, thus leaving the layer on the bottom side of the wafer and the polycrystalline intrinsic silicon in the grooves to support the wafer.

6. The method according to claim 1 in which said thin polycrystalline intrinsic silicon layer is applied by low pressure chemical vapor deposition techniques.

7. The method according to claim 6 in which said polycrystalline intrinsic silicon layers on the top of the wafer are subsequently removed by polishing, thus leaving the layer on the bottom side of the wafer and the polycrystalline intrinsic silicon in the grooves to support the wafer.

* * * * *